United States Patent
Subramanian

(10) Patent No.: US 7,915,087 B2
(45) Date of Patent: Mar. 29, 2011

(54) METHOD OF ARRANGING DIES IN A WAFER FOR EASY INKLESS PARTIAL WAFER PROCESS

(75) Inventor: Balamurugan Subramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/418,909

(22) Filed: Apr. 6, 2009

(65) Prior Publication Data

US 2009/0191689 A1 Jul. 30, 2009

Related U.S. Application Data

(62) Division of application No. 11/545,191, filed on Oct. 10, 2006, now Pat. No. 7,534,655.

(51) Int. Cl.
*H01L 21/00* (2006.01)
(52) U.S. Cl. .................. 438/113; 438/462; 257/E21.599
(58) Field of Classification Search .................... 438/113
See application file for complete search history.

(56) References Cited

U.S. PATENT DOCUMENTS 5,459,340 A * 10/1995 Anderson et al. ............. 257/203
2006/0003234 A1 * 1/2006 Woolaway et al. ............... 430/5

* cited by examiner

*Primary Examiner* — Savitri Mulpuri
(74) *Attorney, Agent, or Firm* — Yingsheng Tung; Wade J. Brady, III; Frederick J. Telecky, Jr.

(57) ABSTRACT

In a method and system for fabricating a full wafer (600) having dies, an orientation marker (606), and a reference die (608), includes configuring a reticle pattern (602) that is configured by arranging the dies in an array having m rows and n columns, where the m rows start in a row adjacent to the orientation marker (606), and m and n are integers. The reticle pattern (602) is transferred to the full wafer (600) to sequentially form a portion of the dies. The transferring includes placing an inkless marker (620) in the form of one or more non-circuit dies between the n columns of adjacent reticle patterns. The reticle pattern (602) is repeatedly transferred to form a remaining portion of the dies to complete the full wafer (600). A wafer map for the full wafer (600) is stored, with the wafer map including a non-circuit bin containing data describing the inkless marker (620).

8 Claims, 10 Drawing Sheets

METHOD OF ARRANGING DIES IN A WAFER FOR EASY INKLESS PARTIAL WAFER PROCESS

This application is a division of application Ser. No. 11/545,191 filed Oct. 10, 2006, the contents of which are herein incorporated by referenced in its entirety.

BACKGROUND

This invention relates to partial wafer processing and more particularly to processing multiple random size wafers in pick and place equipment for operations using a wafer map.

A typical semiconductor wafer 100 containing a plurality of dies and having an orientation marker 102 (e.g., in the form of a flat edge, a wafer flat, a wafer notch, or similar other) is illustrated in FIG. 1, according to prior art. An inkless assembly process uses an electronic wafer map instead of ink to describe die attributes such as quality, and position. The quality may be expressed as a single bit value, e.g., good or bad, accept or reject, or multiple bit value such as good first grade, and good second grade. The wafer map includes data and/or information that provides an exact location and test results for each die on the wafer. The exact location for each die is determined by using a wafer map coordinate system set up with reference to a reference die 112 located at origin (0,0). A mirror area 106 may be used to determine the location of the reference die 112. The accept-reject function of a pick-and-place system is driven by the wafer map instead of being controlled by an optical detector to detect a presence of the ink. Thus, the inkless assembly process based on the wafer map eliminates the need for inking a reject die at a wafer fabrication facility by using the wafer map data available from a probe tester to position the wafer to the exact location of all the good dies on pick-and-place systems such as a die bonder or tape and reel. Direct positioning on the good dies is possible without scanning the entire wafer.

The wafer map data includes a plurality of bin numbers to categorize the attributes and/or properties of each one of the dies. For example, bin 1 may include all good first grade dies, bin 2 may include all good second grade dies, bin 3 may include all plug dies, bin 4 may include all bad edge dies, and bin 5 may include edge bad dies. Each die may be placed in a particular bin based on the results of the probe testing. A full wafer such as the wafer 100 has one reference die such as the reference die 112. Wafers may be processed as a full wafer and/or as a partial wafer such as halves illustrated in FIG. 2, quarters illustrated in FIG. 3, and/or any portion of the full wafer as illustrated in FIG. 4, according to prior art, to match production lot size at an Assembly/Test (A/T) facility including a partial wafer processor. In case of partial wafers, reference die for each piece of the wafer is generally not available. Without a method to process partial wafers using wafer map, small die wafer map operation is incomplete and cannot be fully implemented in assembly operations. Alternatives like scrapping partial wafers or processing all dies on partial wafers are not cost effective solutions.

However, traditional tools and methods for assembly and fabrication of semiconductor devices may be inadequate to process inkless partial wafers same as full inkless wafers. Many partial wafer processing techniques may require additional, specialized hardware, and/or software for the assembly equipment used. Thus, the specialized solution may not be easily implementable and transportable across multiple vendors or contractors performing the partial wafer processing.

SUMMARY

Applicant recognizes an existing need for an improved method and system for processing inkless partial wafers that is the same as full inkless wafers; and the need for an improved technique to fabricate the full wafer that provides built in reference markers to facilitate inkless partial wafer assembly that is the same as full inkless wafers, absent the disadvantages found in the prior techniques discussed above.

The foregoing need is addressed by the teachings of the present disclosure, which relates to a system and method for fabricating a partial-friendly full wafer. According to one embodiment, in a method and system for fabricating a full wafer having dies, an orientation marker, and a reference die, includes configuring a reticle pattern that is configured by arranging the dies in an array having m rows and n columns, where the m rows start in a row adjacent to the orientation marker, and m and n are integers. The reticle pattern is transferred to the full wafer to sequentially form a portion of the dies. The transferring includes placing an inkless marker in the form of one or more non-circuit dies between the n columns of adjacent reticle patterns. The reticle pattern is repeatedly transferred to form a remaining portion of the dies to complete the full wafer. A wafer map for the full wafer is stored, with the wafer map including a non-circuit bin containing data describing the inkless marker.

In one aspect of the disclosure, a method for inkless wafer processing, includes receiving a full wafer. The full wafer includes partial wafers, an orientation marker, and a reference die. At least one non-circuit die on the full wafer is selected, the at least one non-circuit die being used in the inkless wafer processing. The full wafer is cut along an edge of a selected one of the non-circuit die to provide the partial wafers. The cutting is performed in a particular direction relative to the orientation marker. The cutting provides a first one of the partial wafers containing the reference die, and a second one of the partial wafers containing the selected one of the non-circuit die but excluding the reference die. One partial wafer is selected from the partial wafers. The partial wafer is singulated to provide singular dies. The partial wafer is loaded for placement of the singular dies. A wafer map data for the full wafer is received and the partial wafer is identified. A non-circuit die that has the same row as the reference die is located from the wafer map data corresponding to the partial wafer. A pseudo reference die corresponding to the partial wafer is assigned, where the pseudo reference die and the selected one of the non-circuit die are disposed adjacently in the same row. The placement of the singular dies is initiated using the pseudo reference die as a reference die for the partial wafer.

Several advantages are achieved by the method and system according to the illustrative embodiments presented herein. The embodiments advantageously provide tools and techniques to fabricate partial-friendly wafers in a fab. These partial-friendly wafers may be advantageously processed by wafer processors or subcontractors in a manner that is the same as processing full inkless wafers. Thus, one full wafer may be advantageously split, and either processed in-house or sent as partial wafers to different sites or subcontractors for processing without installing additional hardware and/or processing equipment, since processing each partial wafer is same as processing the full wafer. The full wafer may be advantageously cut in multiple random size partial wafers to match production demand, thereby reducing inventory and enabling just-in-time manufacturing. These improved tools and techniques are supported by virtually all pick-and-place systems available in the market.

DETAILED DESCRIPTION

Figure 1:
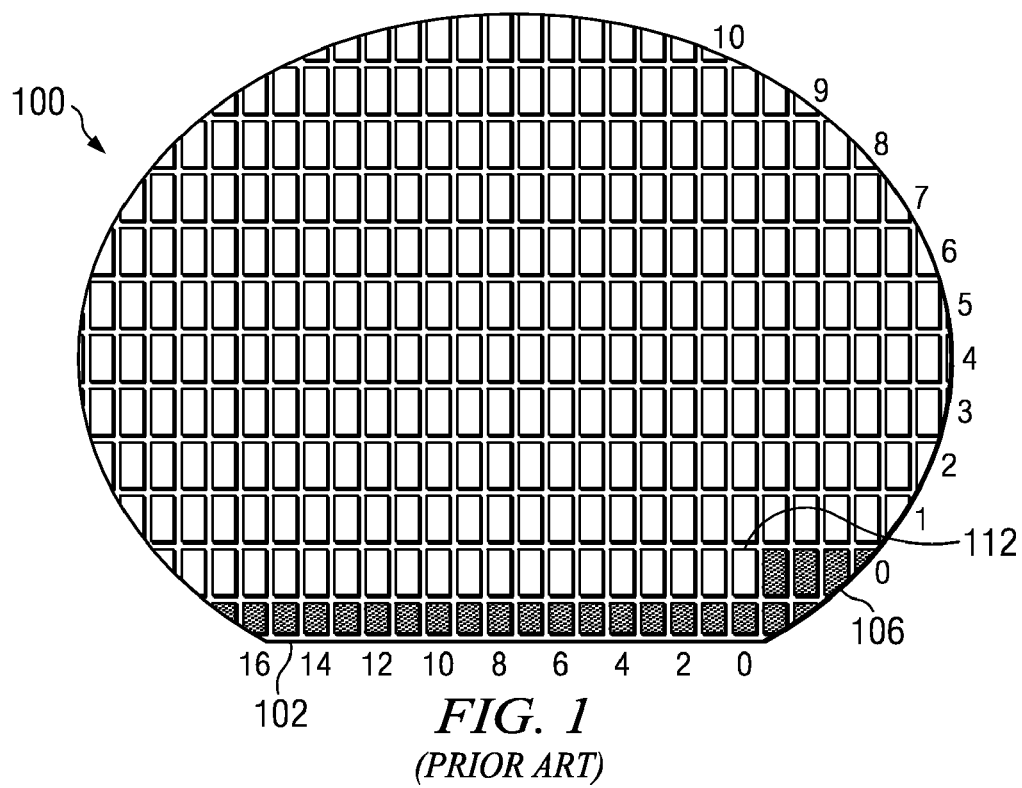
FIG. 1 illustrates a semiconductor wafer, described herein above, according to prior art.
Figure 2:
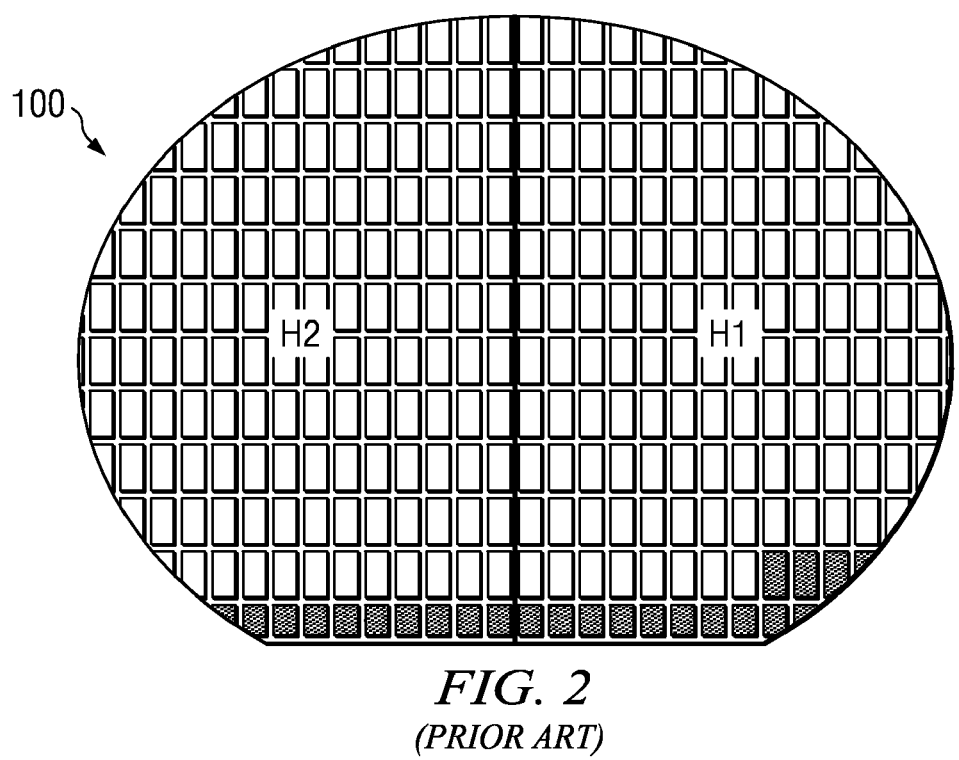
FIG. 2 illustrates a semiconductor wafer divided into halves, described herein above, according to prior art.
Figure 3:
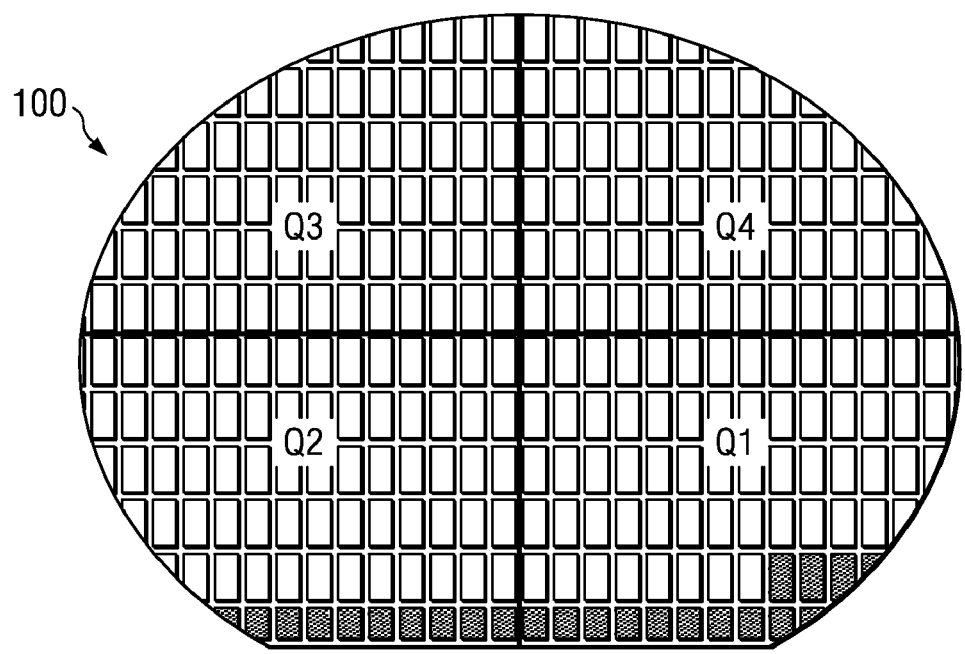
FIG. 3 illustrates a semiconductor wafer divided into quarters, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements. Similarly, the functionality of various mechanical elements, members, and/or components for forming modules, sub-assemblies and assemblies assembled in accordance with a structure for an apparatus may be implemented using various materials and coupling techniques, depending on the application requirements.

Traditional tools and methods for assembly and fabrication of semiconductor devices may be inadequate to process inkless partial wafers same as full inkless wafers. As a result, specialized (often proprietary) hardware, and/or software may be needed for partial wafer processing. Thus, the specialized tools and techniques may not be easily implementable and transportable across multiple vendors or contractors performing the partial wafer processing. This problem may be addressed by an improved system and method for fabricating and processing an inkless full wafer. According to an embodiment, in an improved system and method for fabricating a full wafer having dies, an orientation marker, and a reference die, includes configuring a reticle pattern that is configured by arranging the dies in an array having m rows and n columns, where the m rows start in a row adjacent to the orientation marker, and m and n are integers. The reticle pattern is transferred to the full wafer to sequentially form a portion of the dies. The transferring includes placing an inkless marker in the form of one or more non-circuit dies between the n columns of adjacent reticle patterns. The reticle pattern is repeatedly transferred to form a remaining portion of the dies to complete the full wafer. A wafer map for the full wafer is stored, with the wafer map including a non-circuit bin containing data describing the inkless marker.

The following terminology may be useful in understanding the present disclosure. It is to be understood that the terminology described herein is for the purpose of description and should not be regarded as limiting.

Wafer—A thin slice with parallel faces cut from a semiconductor material.

Partial-friendly Wafer—A partial-friendly wafer includes at least one inkless marker, the inkless marker being different than a reference die that is typically included on a full inkless wafer. The partial-friendly wafer is fabricated, and is processable by using the same tools and techniques that may be used to fabricate as well as process a full inkless wafer. Thus, the wafer that is partial-friendly does not require additional or specialized hardware, assembly or processing equipment, or software for the fabrication and processing compared to the full inkless wafer.

Reticle—A mask that is intended for use in a step-and-repeat lithography process. The reticle is typically a flat glass plate that contains circuit patterns to be reproduced on a wafer to form the dies. The reticle does not make direct contact with the wafer, but rather light is projected through the reticle on to the wafer.

Configuration—Describes a set up of an element, a circuit, a package, an electronic device, and similar other, and refers to a process for setting, defining, or selecting particular properties, parameters, or attributes of the device prior to its use. Some configuration attributes may be selected to have a default value. For example, a reticle pattern is configurable to include m rows and n columns, where m=3 and n=7, a full wafer is configurable to be split into n partial wafers, where n is an integer, and a full wafer is configurable to be cut in a particular direction that is perpendicular to a wafer flat that is used as an orientation marker.

The fabrication of inkless partial wafers that are partial-friendly is described with reference to FIGS. 6A, 6B, 6C, 6D, 6E, 6F, 6G, and 6H. The use and/or the processing of the inkless partial wafers that are partial-friendly, and are fabricated as described with reference to FIGS. 6A, 6B, 6C, 6D, 6E, 6F, 6G, and 6H is described with reference to FIGS. 6I, 6J, 6K, 6L and 6M.

Figure 5:
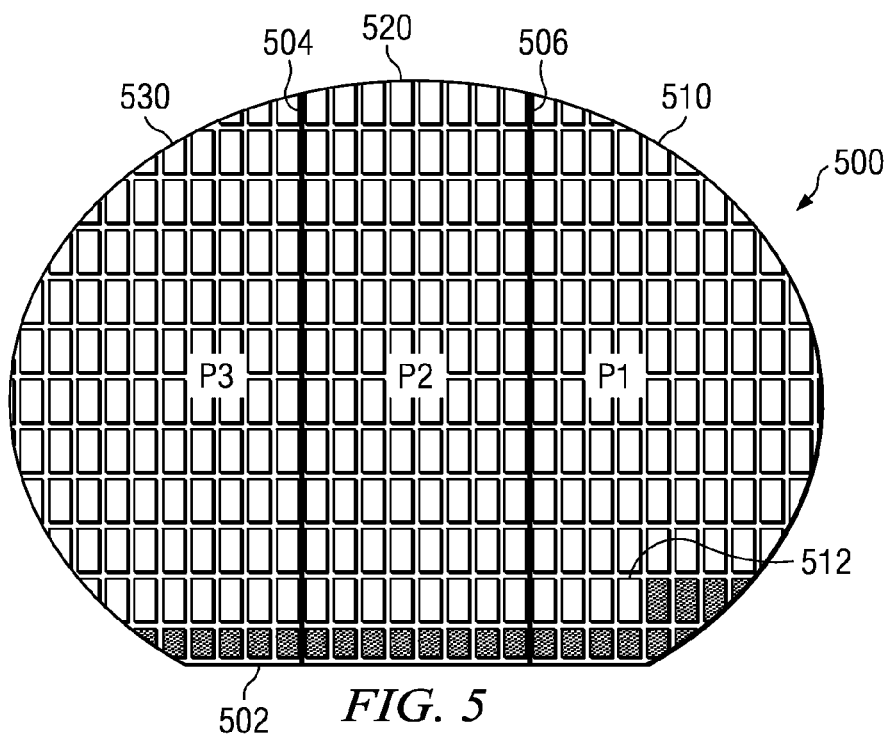
FIG. 5 illustrates a full wafer having inkless partial wafers that are partial-friendly, according to an embodiment.

FIG. 5 illustrates a full wafer 500, which may be cut to form inkless partial wafers that are partial-friendly, according to an embodiment. In the fabrication and processing of inkless partial wafers according to the present disclosure there are certain assumptions, as follows: 1) A full wafer 500 is cut along wafer cuts 504 and 506, each of which along a particular direction relative to the orientation marker 502, e.g., along a direction that is perpendicular to the orientation marker 502, to provide partial wafers P1 510, P2 520 and P3 530, as illustrated in FIG. 5. Although the full wafer 500 is shown to include three partial wafers, the number of partial wafers cut from a full wafer may vary depending on various factors such as desired production quantity. 2) At least one of the partial wafers, e.g., P1 510 must include a reference die 512, and the remaining ones of the partial wafers, e.g., P2 520 and P3 530, exclude the reference die 512 but include a pseudo reference die (not shown). Additional details of establishing a pseudo reference die for each one of the P2 520 and P3 530 partial wafers is described with reference to FIG. 6M.

Figure 6A:
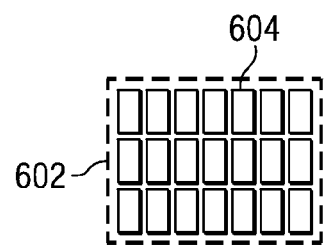
FIG. 6A illustrates a reticle pattern, according to an embodiment.

FIG. 6A illustrates a reticle pattern 602, according to an embodiment. In the depicted embodiment, the reticle pattern 602 is configured or defined by arranging dies 604 in a matrix array having m rows and n columns, where m is equal to 3 and n is equal to 7, m and n being integer variables. The particular integer values selected for m and n may vary depending on factors such as die size, wafer size, lithography process and equipment used, and similar others. A minimum size for the reticle pattern 602 is a 1×1 array, e.g., a singular die.

Figure 6B:
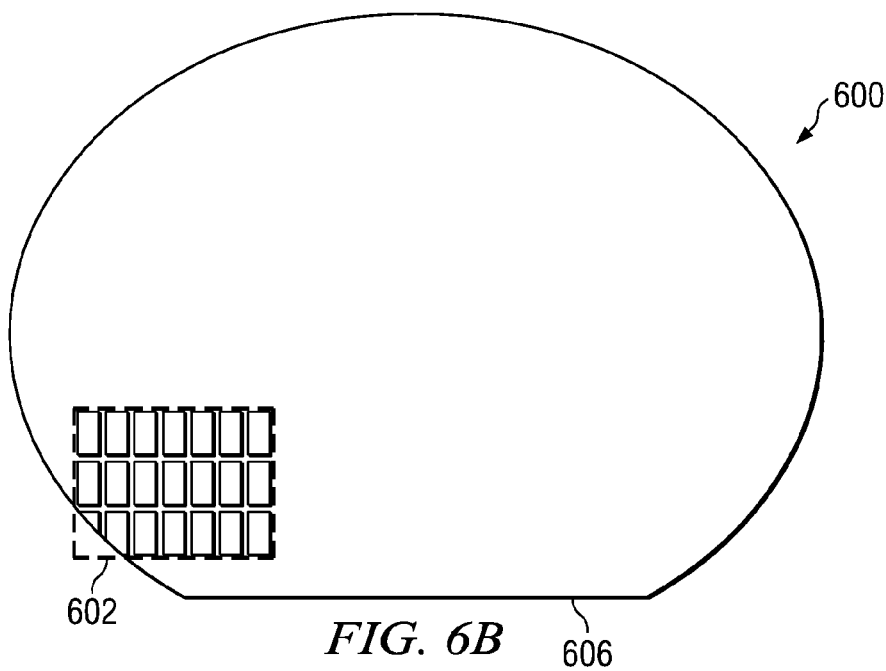
FIGS. 6B, 6C and 6D illustrate a sequence to transfer a reticle pattern described with reference to FIG. 6A on to a full wafer, according to an embodiment.
Figure 6C:
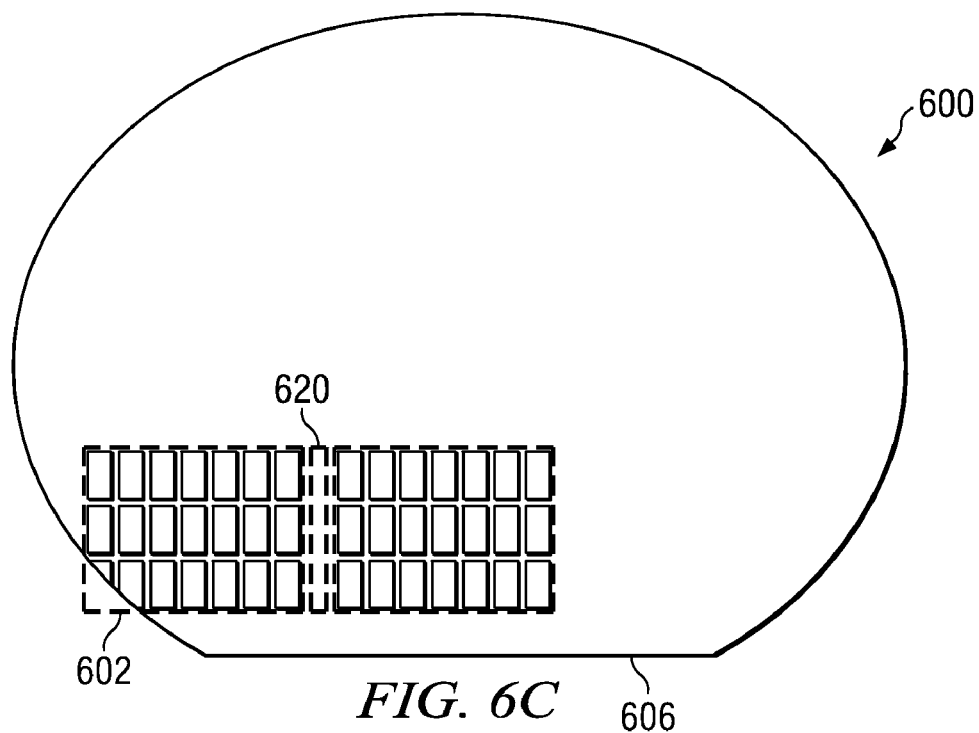
Figure 6D:
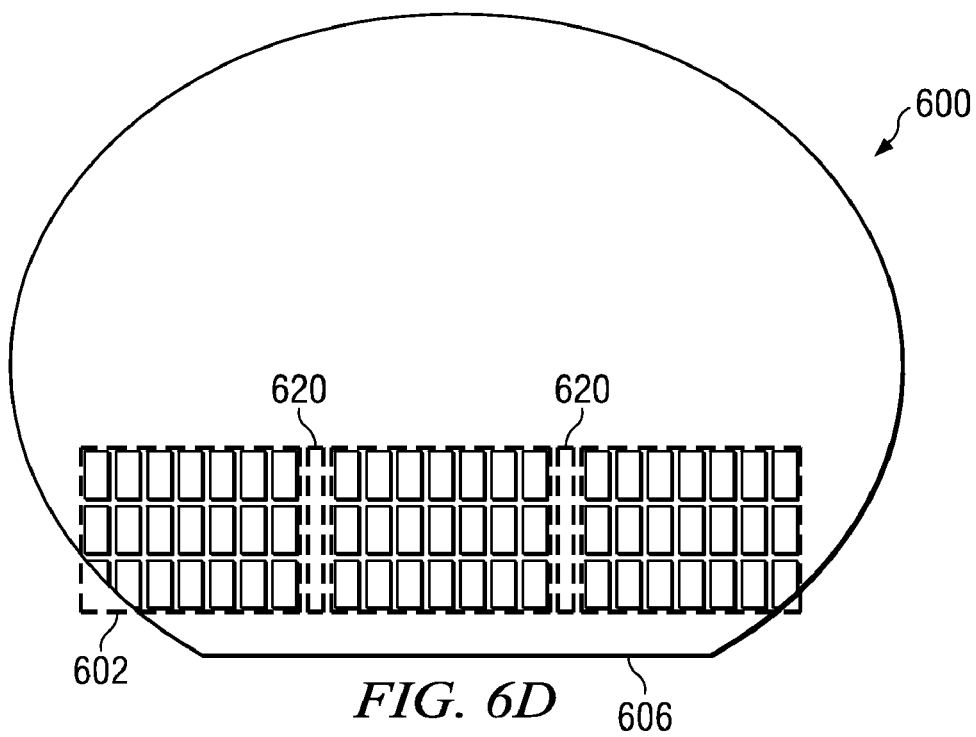

FIGS. 6B, 6C and 6D illustrate a sequence to transfer the reticle pattern 602 described with reference to FIG. 6A on to a full wafer 600, according to an embodiment. In an embodiment, the full wafer 600 is the same as the full wafer 500 described with reference to FIG. 5. Prior to the transfer of the reticle pattern 602, the full wafer 600 is blank, e.g., contains no circuit patterns or dies, but does include an orientation marker 606. FIG. 6B illustrates a first one of the reticle pattern 602 transferred to the full wafer 600. The first one of the reticle pattern 602 shares a common edge with the orientation marker 606. FIG. 6C illustrates a second one of the reticle pattern 602 transferred to the full wafer 600. An inkless marker 620 is placed between the n columns of the second one of the reticle pattern 602, and the n columns of the first one of the reticle pattern 602. In a particular embodiment, the inkless marker 620 is a distinguishing marker such as a blank portion of the wafer or a die with no circuit (a non-circuit die). The second one of the reticle pattern 602 also shares a common edge with the orientation marker 606.

FIG. 6D illustrates a third one of the reticle pattern 602 transferred to the full wafer 600. Another one of the inkless marker 620 is placed between the n columns of the second one of the reticle pattern 602 and the n columns of the third one of the reticle pattern 602. The third one of the reticle pattern 602 shares a common edge with the orientation marker 606. The process of transferring the reticle pattern 602 to the full wafer 600 is repeated to form the remaining portion of the dies, and thereby complete the fabrication of the full wafer 600. The reticle pattern 602 is transferred to the full wafer 600 without overlapping of the dies.

Figure 6E:
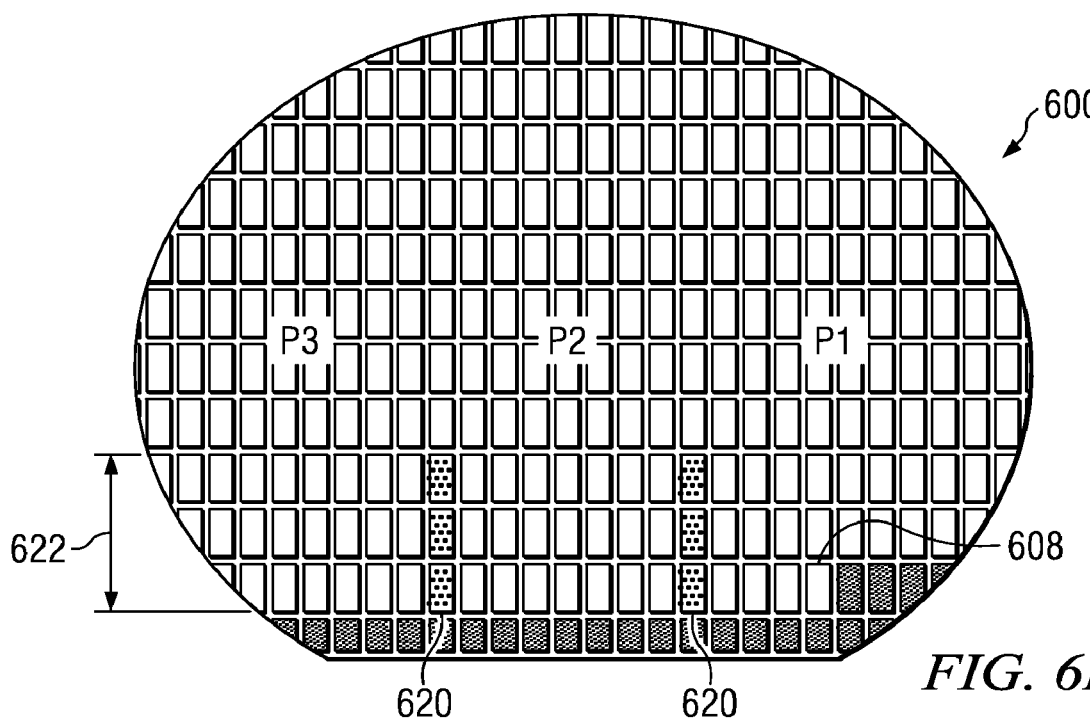
FIGS. 6E, 6F, 6G and 6H illustrate a full wafer having an inkless marker of variable dimensions, according to an embodiment.
Figure 6F:
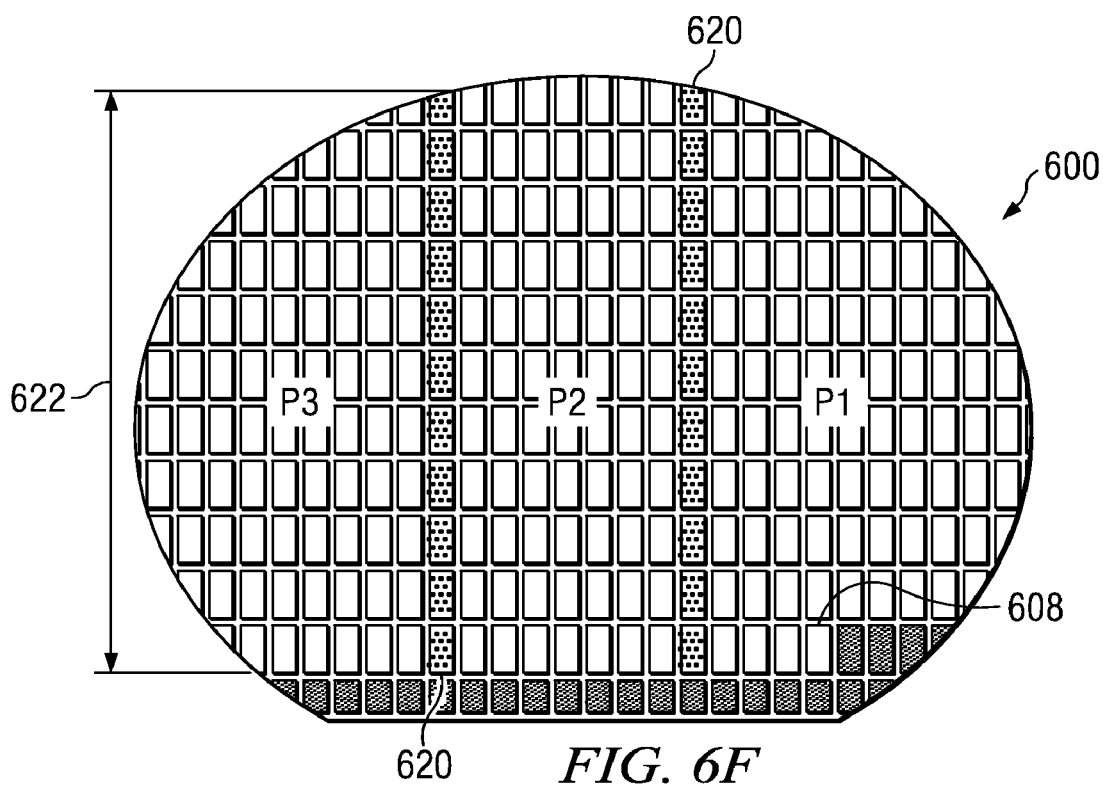
Figure 6G:
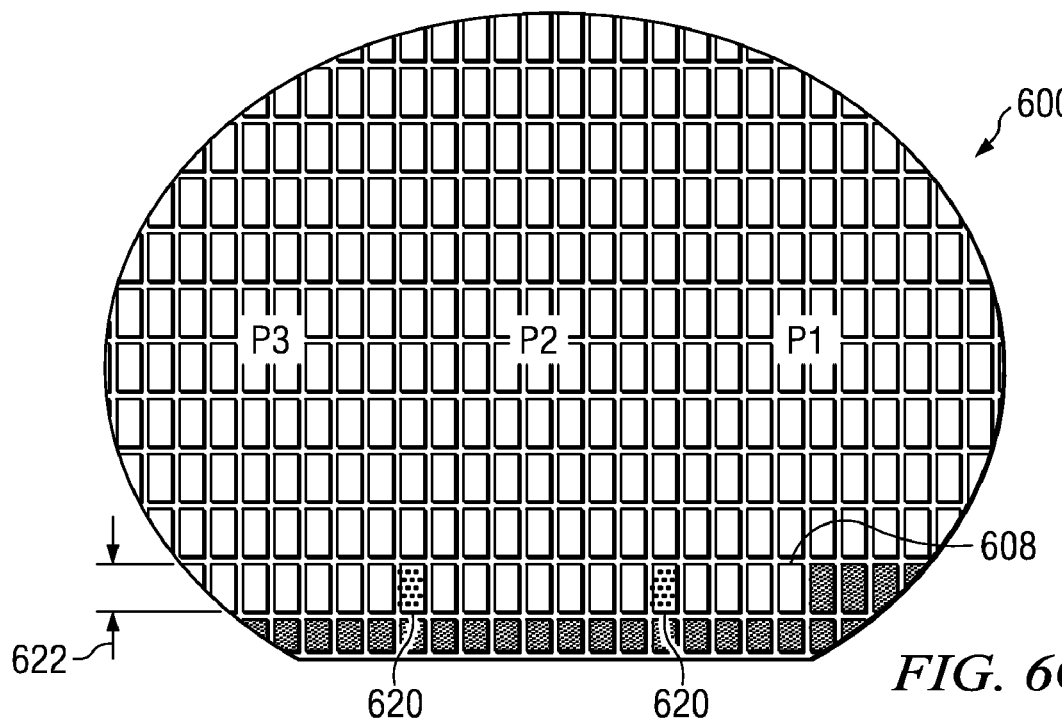

In an embodiment, characteristics or attributes of the inkless marker 620 such as height and width may be varied as illustrated in FIGS. 6E, 6F, 6G and 6H. FIG. 6E illustrates a height 622 of the inkless marker 620 that is equal to the height of the reticle pattern 602, e.g., equal to m rows where m is equal to 3. In this embodiment, rows disposed above each one of the inkless marker 620 are advantageously utilized for forming the dies. FIG. 6F illustrates the height 622 of the inkless marker 620 that is equal to the height of an entire column of the full wafer 600. FIG. 6G illustrates the height 622 of the inkless marker 620 to be equal to a single row, e.g., same as the height of the row of the reference die 608. That is, the dimensions of the inkless marker 620 are the same as the dimensions of the reference die 608. In the depicted embodiment, rows disposed above each one of the inkless marker 620 are advantageously utilized for forming the dies.

Figure 6H:
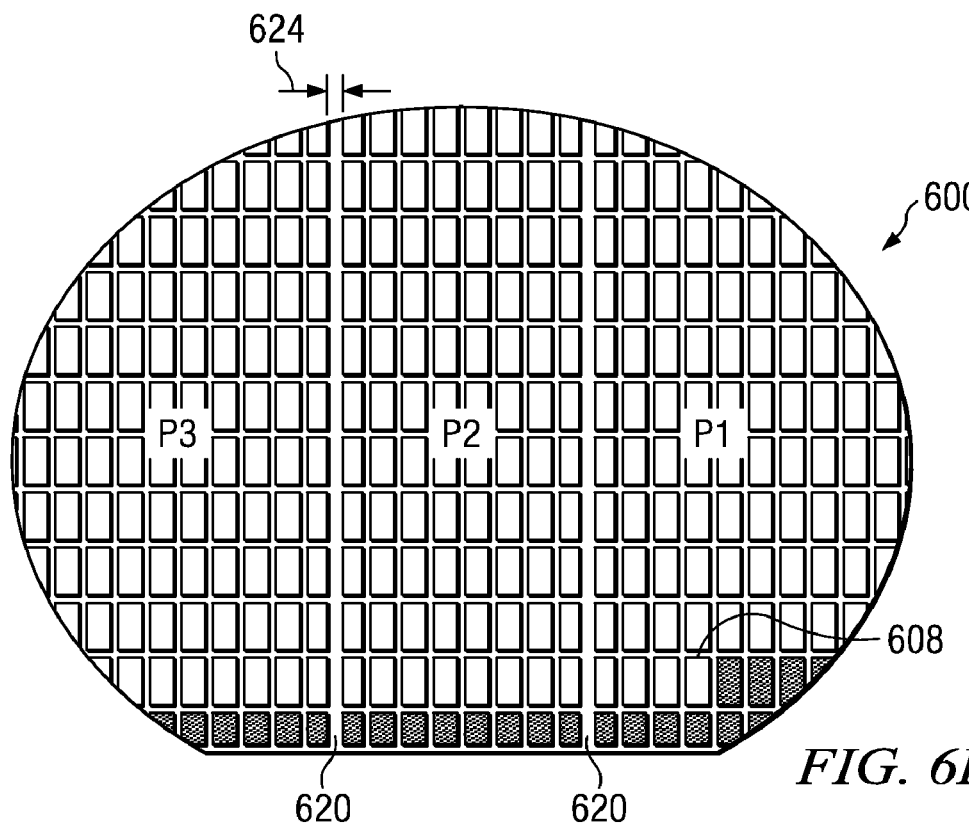

In an embodiment, fabrication of the inkless marker 620 having height 622 that is equal to a single row may be implemented by using masking techniques for the reticle pattern 602. For example, (m−1) rows and n columns are masked off so that only one row having n dies is transferred. After the first row is complete, a full reticle pattern may be used for all pattern dies in the wafer. FIG. 6H illustrates the inkless marker 620 being in the form of an extra wide street having an adjustable width 624, according to an embodiment. In an embodiment, the adjustable width 624 of the extra wide street is greater than a street width of the reticle pattern 602, and at most equal to a width of the reference die 608.

Referring back to FIGS. 6A through 6H, once the transferring of the reticle pattern 602 is complete and the full wafer 600 with the dies is fabricated, a wafer map (not shown) of the full wafer 600 having the dies is created and stored for later use. As described earlier, the wafer map includes data and/or information that provides an exact location and test results for each die on the full wafer 600. The wafer map also includes a plurality of bins (not shown) to categorize the attributes and/or properties of each one of the dies such as good, bad, and edge dies. Each die may be placed in a particular bin based on the results of the probe testing. In a particular embodiment, the wafer map includes a non-circuit bin (not shown) containing data that describes each one of the inkless marker 620. In an embodiment, each one of the inkless marker 620 may be advantageously used to determine a location of a pseudo reference die corresponding to each partial wafer formed from the full wafer 600. Additional details of establishing a pseudo reference die for each partial wafer formed is described with reference to FIG. 6M.

Referring to FIGS. 6A through 6H, although these figures illustrate the full wafer 600 having a zero degree of wafer rotation angle, the tools and techniques described herein are applicable for different rotation angles.

FIGS. 6I through 6M illustrate the processing of partial-friendly inkless wafers, according to an embodiment. In an embodiment, a full inkless wafer that is partial-friendly, e.g., fabricated to include inkless partial wafers that are partial-friendly as described with reference to FIGS. 6A, 6B, 6C, 6D, 6E, 6F, 6G, and 6H, may be cut to provide at least two partial wafers. Each one of the partial wafers may be processed by an assembly test (A/T) facility including a partial wafer processor or a subcontractor by using tools and techniques that are the same for processing the full inkless wafer.

Figure 6I:
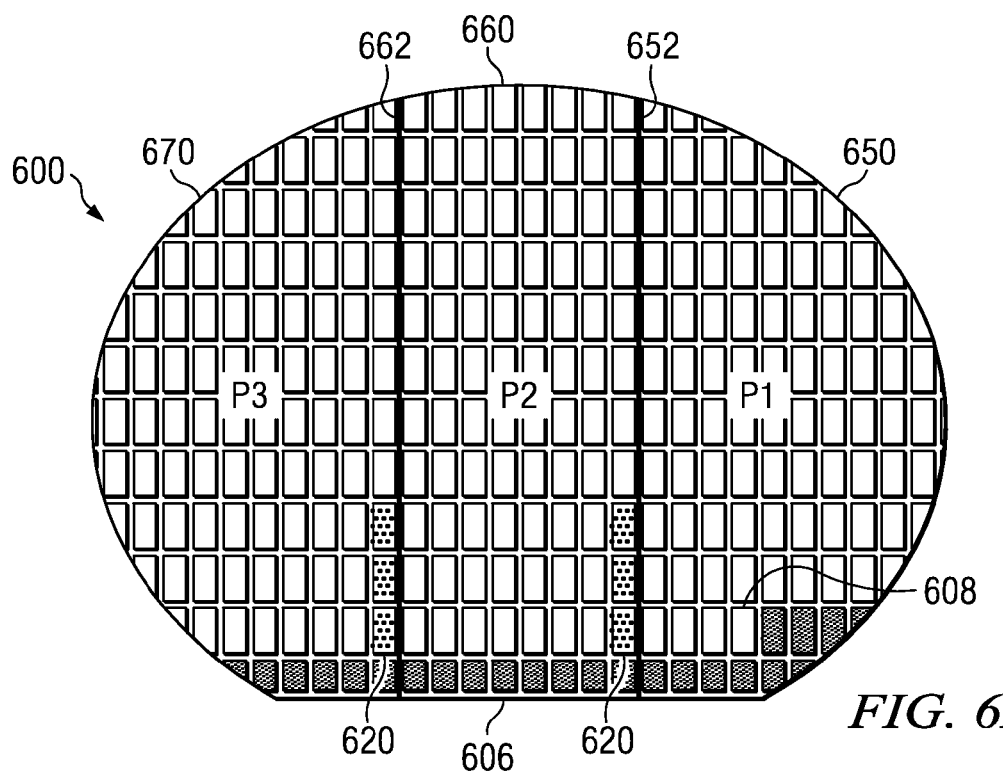
FIGS. 6I, 6J, 6K, 6L and 6M illustrate processing of partial-friendly inkless wafers, according to an embodiment.
Figure 6J:
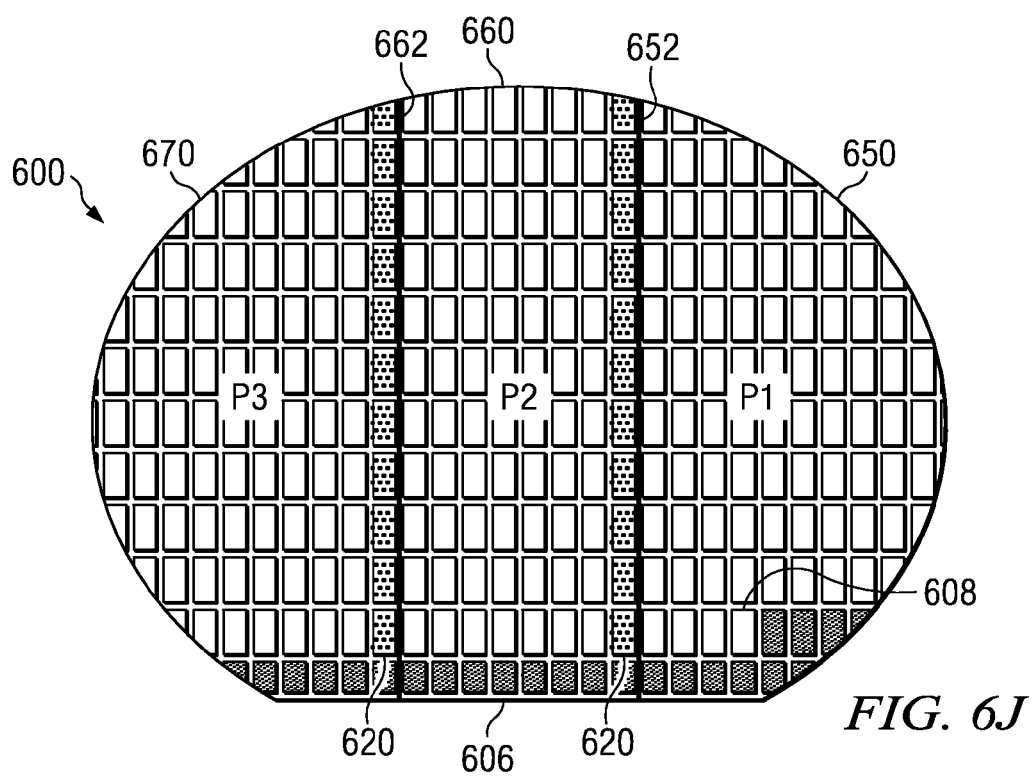
Figure 6K:
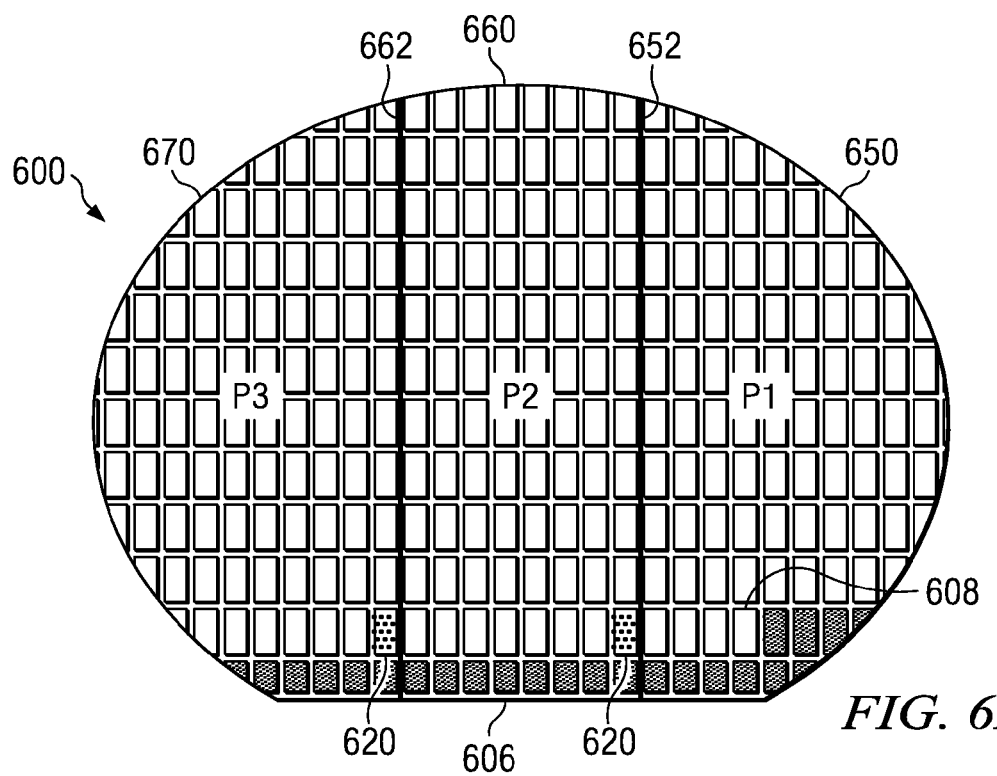
Figure 6L:
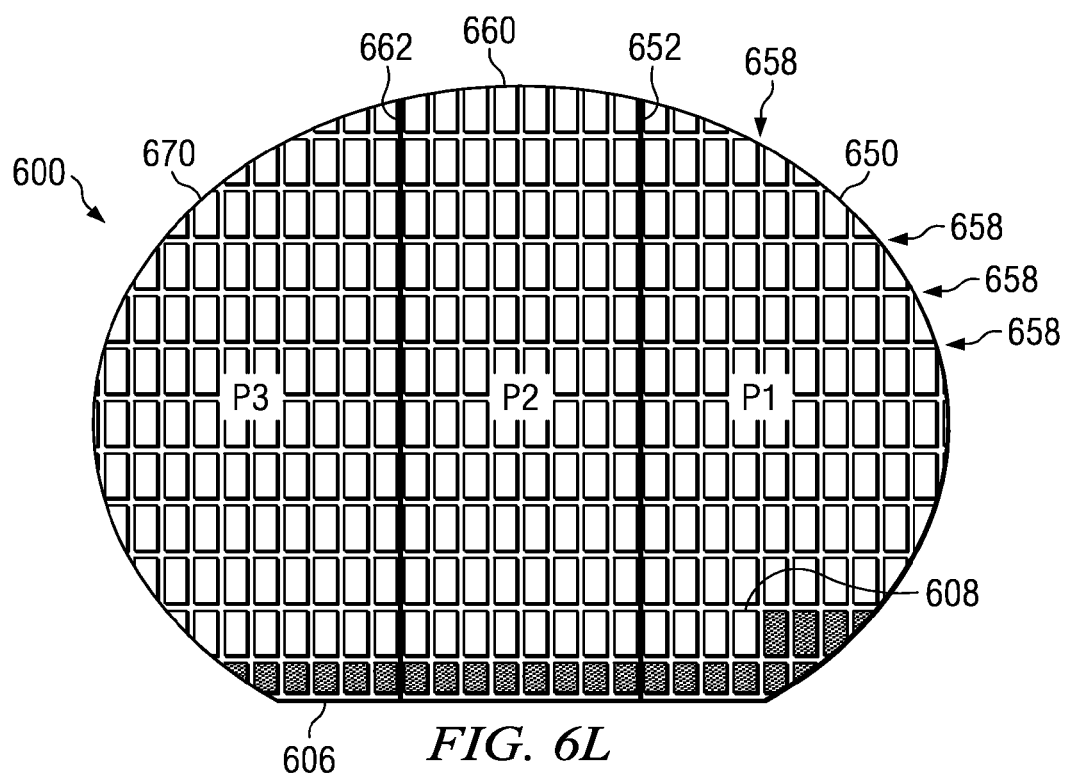

A maximum number of partial wafers included in the full wafer 600 that is partial-friendly equals to a number of instances of the inkless marker 620 plus one. As described earlier, the desired number of partial wafers that may be cut from a full wafer may vary (less than or equal to the maximum number) depending on various factors such as desired production quantity. FIG. 6I illustrates the full wafer 600 which may be cut into 3 partial wafers, corresponding to 2 instances or occurrences of the inkless marker 620. The full wafer 600 may be cut or sawed along an edge, e.g., an edge that is located closest to the reference die 608, of a selected one of the inkless marker 620, e.g., a non-circuit die as illustrated in FIGS. 6J and 6K, or an extra wide street as illustrated in FIG. 6L, to provide the partial wafers. In the depicted embodiment, the cut is in a particular direction relative to the orientation marker 606, e.g., in a perpendicular direction relative to a wafer flat used as the orientation marker 606. The process of cutting provides a first one of the partial wafers containing the reference die, and a second one of the partial wafers containing the selected one of the non-circuit die but excluding the reference die 608. Referring to FIG. 6L, the inkless marker 620 is implemented as the extra wide street having an adjustable width, according to an embodiment. The adjustable width of the extra wide street is greater than a street width 658 of the reticle pattern 602, and at most equal to a width of the reference die 608.

Referring back to FIGS. 6I through 6L, the full wafer 600 is segmented into 3 partial wafers P1 650, P2 660, and P3 670. Adjacently disposed partial wafers, e.g., P1 650 and P2 660 share an edge (along a saw street) 652 that is perpendicular to a wafer flat used as the orientation marker 606. Similarly, adjacently disposed partial wafers, e.g., P2 660 and P3 670 share an edge (along a saw street) 662 that is perpendicular to the wafer flat used as the orientation marker 606. The partial wafer P1 650 includes the reference die 608 for the full wafer 600, whereas the remaining ones of the partial wafers P2 660 and P3 670 include a corresponding one of the inkless marker 620 but exclude the reference die 608. In an exemplary, non-depicted embodiment, the full wafer 600 may be cut along the edge 652 to form the partial wafer P1 650, and a combined partial wafer P2 660+P3 670. In another embodiment, the full wafer 600 may be cut along the edge 662 to form a combined partial wafer P1 650+P2 660 and the partial wafer P3 670. In yet another embodiment, the full wafer 600 may be cut along the edges 652 and 662 to form the three partial wafers P1 650, P2 660, and P3 670.

Figure 4:
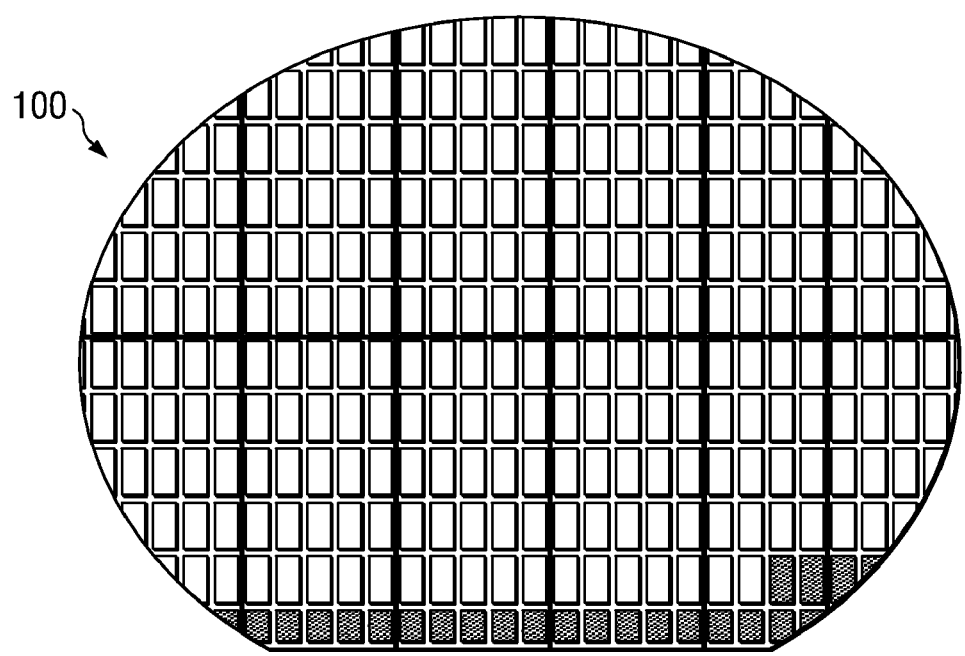
FIG. 4 illustrates a semiconductor wafer divided into partial wafers, described herein above, according to prior art.
Figure 6M:
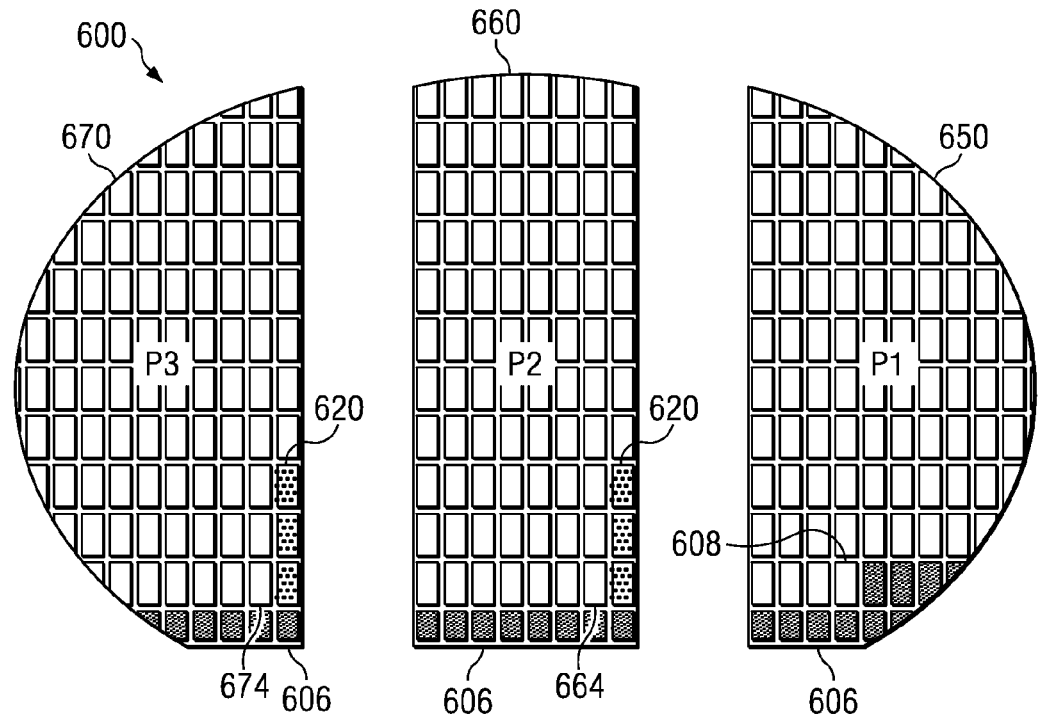

FIG. 6M illustrates the full wafer 600 described with reference to FIG. 6I cut into 3 partial wafers P1 650, P2 660, and P3 670, according to an embodiment. It is understood that although the partial wafers are shown to be cut in a direction perpendicular to a wafer flat used as the orientation marker 606, the cuts may be made in a direction parallel to the wafer flat used as the orientation marker 606, as shown in FIG. 4.

Although 3 partial wafers are shown, the sawing or cutting of the full wafer 600 provides at least two partial wafers. A partial wafer is selected from the partial wafers, e.g., any one of P1 650, P2 660, and P3 670, or a valid combination thereof (e.g., P2 660+P3 670 or P1 650+P2 660). The partial wafer is singulated and loaded onto a wafer table of a pick-and-place system (not shown) for placement of the singulated dies. The pick-and-place system receives the wafer map data for the full wafer 600, e.g., from a host computer, along with the full wafer. The partial wafer is identified. The identification technique may be based on scanning the partial wafer, and comparing with known data or pattern to determine a match with one of the partial wafers, e.g., one of P1 650, P2 660, and P3 670 or a valid combination thereof. The partial wafer may be scanned to locate: the reference die 608 (if present), the orientation marker 606, shape of an edge of the partial wafer, each instance of the inkless marker 620, or a combination thereof to assist in the identification. In an embodiment, the identification technique may use an algorithm to identify the selected one of the partial wafers based on inputs.

If the partial wafer includes the reference die 608, e.g., by selecting P1 650, then the pick-and-place system processes the partial wafer using the reference die 608. If the partial wafer excludes the reference die 608, then a pseudo reference die location is determined, and is used as a local reference for the pick-and-place system. In an embodiment, for the selected one of the partial wafers, the inkless marker 620 located in the same row as the reference die 608 is selected from the non-circuit bin of the wafer map data. The location of the pseudo reference die is selected to be in the same row as the reference die 608, and is disposed adjacent to the inkless marker 620. In an embodiment, if the full wafer 600 is cut into partial wafers that include a horizontal cut, e.g., as shown in FIG. 4, the location of the pseudo reference for the upper half of the partial wafers may be selected to be in the row above the horizontal cut, and disposed adjacent to the inkless marker 620. In an embodiment, co-ordinate information related to the selected one of the partial wafers is retained from the wafer map data for the full wafer 600, whereas co-ordinate information for non-selected partial wafers is discarded. The pick-and-place system initiates the placement of the singulated dies for the partial wafer by using the corresponding pseudo reference die as the local reference. Thus, by utilizing the inkless marker to establish a pseudo reference corresponding to each partial wafer, the processing for the partial wafers is the same as the processing of the full wafer having the reference die.

In the depicted embodiment, a third pseudo reference die 674 corresponding to the partial wafer P3 670, and a second pseudo reference die 664 corresponding to the partial wafer P2 660 are selected to be in the same row as the reference die 608, and are disposed adjacent to the corresponding one of the inkless marker 620. Based on the identification of the partial wafer, the third pseudo reference die 674 or the second pseudo reference die 664 is selected as the local reference by the pick-and-place system for the die placement process.

It is understood that the full wafer 600 described with reference to FIGS. 6J through 6L may be cut and pseudo references assigned in a similar manner. Thus, the full wafer 600 described with reference to FIGS. 6J, 6K, and 6L, may also be segmented into the 3 partial wafers P1 650, P2 660, and P3 670, using each instance of the inkless marker 620 for the segmentation, and the selected partial wafer processed the same as the full wafer 600.

Referring to FIGS. 6A, 6B, 6C, 6D, 6E, 6F, 6G, 6H, 6I, 6J, 6K, 6L and 6M, in an embodiment, at least one of the singular dies of the full wafer 600, or a portion thereof, includes electrical circuits for forming one of a microprocessor, a digital signal processor, a radio frequency chip, a memory, a microcontroller, a system-on-a-chip, and a combination thereof.

Figure 7:
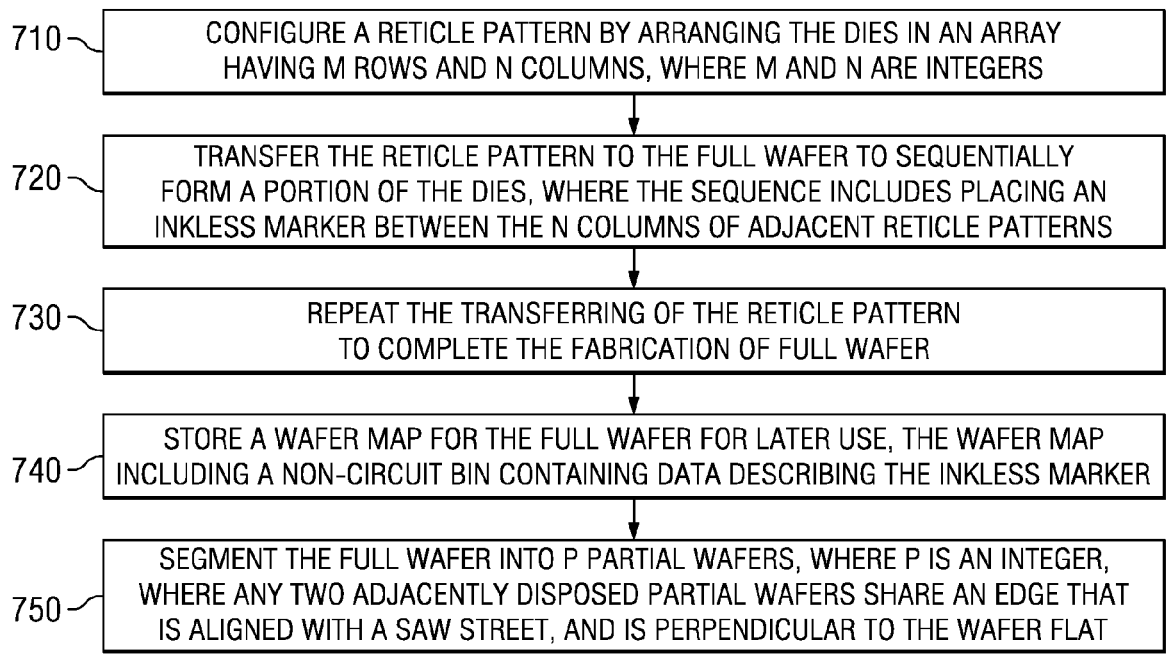
FIG. 7 is a flow chart illustrating a method for fabricating a full wafer, according to an embodiment.

FIG. 7 is a flow chart illustrating a method for fabricating a full wafer, according to an embodiment. In a particular embodiment, the method may be used to fabricate the full wafer 600 described with reference to FIGS. 6A, 6B, 6C, 6D, 6E, 6F, 6G and 6H. At step 710, a reticle pattern is configured by arranging the dies in an array having m rows and n columns, where m and n are integers. The first one of the m rows start in a row adjacent to an orientation marker. At step 720, the reticle pattern is transferred to the full wafer to sequentially form a portion of the dies. The sequence for transferring the reticle pattern includes placing an inkless marker between the n columns of adjacent reticle patterns. At step 730, the transferring of the reticle pattern is repeated to complete the fabrication of full wafer. The transferring occurs without overlapping of the dies to form a remaining portion of the dies. At step 740, a wafer map for the full wafer is stored for later use. The wafer map includes a non-circuit bin containing data describing the inkless marker. At step 750, the full wafer is segmented into p partial wafers, where p is an integer. Any two adjacently disposed partial wafers share an edge that is aligned with a saw street, and is perpendicular to the orientation marker. In an embodiment, the process to create the inkless marker may not be started with a blank full wafer. In this embodiment, the inkless marker may be generated by simply eliminating a step to create the metal layer.

Figure 8:
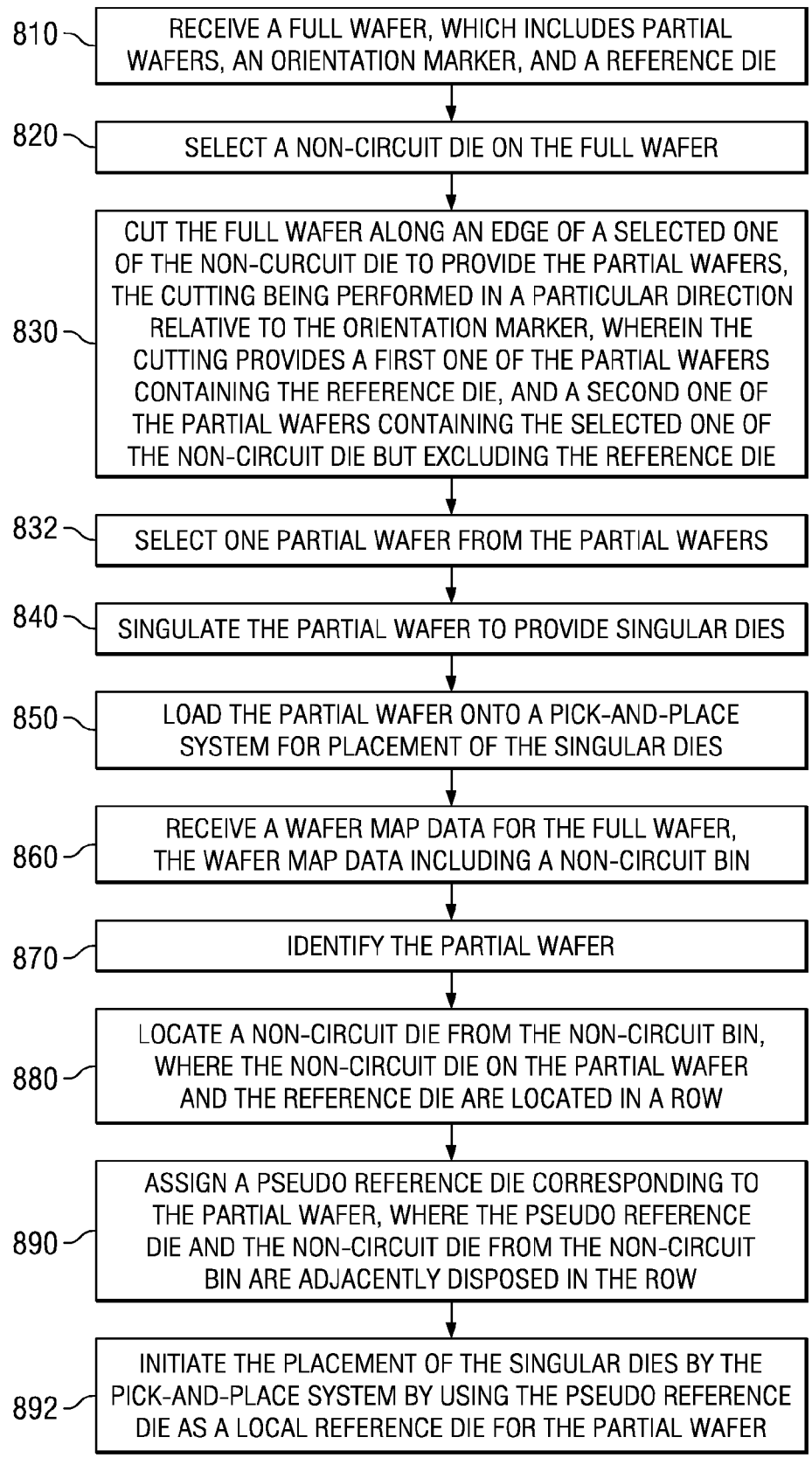
FIG. 8 is a flow chart illustrating additional details of a method for processing an inkless wafer, according to an embodiment.

FIG. 8 is a flow chart illustrating a method for processing an inkless wafer, according to an embodiment. In a particular embodiment, the method is used to process the full wafer 600 described with reference to FIGS. 6I through 6M. At step 810, a full wafer, which includes partial wafers, an orientation marker, and a reference die, is received. At step 820, at least one non-circuit die located on the full wafer is selected, the at least one non-circuit die being used in the inkless wafer processing. At step 830, the full wafer is cut along an edge of a selected one of the non-circuit die to provide the partial wafers. A direction of the cut is perpendicular to the orientation marker. The cutting results in provides a first one of the partial wafers containing the reference die, and a second one of the partial wafers containing the selected one of the non-circuit die but excluding the reference die. At step 832, a partial wafer is selected from the partial wafers. At step 840, the partial wafer is singulated to provide singular dies. At step 850, the partial wafer is loaded onto a pick-and-place system for placement of the singular dies. At step 860, a wafer map data for the full wafer is received. The wafer map data includes a non-circuit bin. At step 870, the partial wafer is identified. At step 880, a non-circuit die from the non-circuit bin is located to have the same row as the reference die, the non-circuit die being located on the selected one of the partial wafers. At step 890, a pseudo reference die corresponding to the partial wafer is assigned, where the pseudo reference die and the selected one of the non-circuit die are disposed adjacently in the same row as the reference die. At step 892, the placement of the singular dies is initiated by the pick-and-place system by using the pseudo reference die as a reference die for the partial wafer.

Various steps described above with reference to FIGS. 7 and 8 may be added, omitted, combined, altered, or performed in different orders. For example, the step 880 may also include an added step for discarding of impertinent wafer map data. That is, only retaining wafer map data for the selected one of the partial wafers.

Several advantages are achieved by the method and system according to the illustrative embodiments presented herein. The embodiments advantageously provide tools and techniques to fabricate partial-friendly wafers in a fab. These partial-friendly wafers may be advantageously processed by wafer processors or subcontractors in a manner that is the same as processing full inkless wafers. Thus, one full wafer may be advantageously split, and either processed in-house or sent as partial wafers to different sites or subcontractors for processing without installing additional hardware and/or processing equipment, since processing each partial wafer is same as processing the full wafer. The full wafer may be advantageously cut in multiple random size partial wafers to match production demand, thereby reducing inventory and enabling just-in-time manufacturing. These improved tools and techniques are supported by virtually all pick-and-place systems available in the market.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, although not illustrated, alternative forms and shapes of semiconductor wafers containing a plurality of dies may be possible. Some wafers may have a circular shape with a notch as a reference for orientation but without the wafer flat. An orientation axis may be set up using the notch as the origin. Although the reference die 112 is shown in FIG. 1 to be located in the first row adjacent to the orientation marker 102, some wafers may use a different die location for the reference die 112. Depending on the size and shape of the mirror area 106, for some wafers the reference die may be located elsewhere on the wafer 100 other than at origin (0,0). As an additional example, while certain aspects of the present disclosure have been described in the context of partial wafers having cuts that are perpendicular to the orientation marker, those of ordinary skill in the art will appreciate that the processes disclosed are capable of being used for fabrication and processing of full or partial wafers having other types of characteristics such as orientation markers, notches, reference die location relative to the orientation marker or notch, type of cuts, and size or shape of an inkless marker.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for fabricating a full wafer, the full wafer including dies, an orientation marker, and a reference die, the method comprising:
    configuring a reticle pattern, wherein the reticle pattern is configured by arranging the dies in an array having m rows and n columns, m and n being integers; and
    transferring the reticle pattern to the full wafer to sequentially form a portion of the dies, wherein the transferring includes placing an inkless marker between the n columns of adjacent reticle patterns;
    segmenting the full wafer into p partial wafers, p being an integer, wherein two adjacently disposed partial wafers share an edge that is perpendicular to the orientation marker; and
    wherein each one of the partial wafers includes at least one inkless marker.

2. The method of claim 1 further comprising:
    repeating the transferring of the reticle pattern to complete the full wafer, the transferring occurring without overlapping to form a remaining portion of the dies; and
    storing a wafer map for the full wafer, wherein the wafer map includes a non-circuit bin containing data describing the inkless marker.

3. The method of claim 1, wherein the inkless marker is a column of non-circuit dies.

4. The method of claim 3, wherein a height of the column of the non-circuit dies is limited to the m rows.

5. The method of claim 3, wherein a height of the column of the non-circuit dies is limited to a singular die.

6. The method of claim 1, wherein the inkless marker is an extra wide saw street having an adjustable width, wherein the adjustable width is greater than a street width of the reticle pattern and at most equal to a width of the reference die.

7. The method of claim 1, wherein the inkless marker is used to determine a location of a pseudo reference die for each partial wafer formed from the full wafer.

8. The method of claim 1, wherein a die included in the dies is one of a microprocessor, a digital signal processor, a radio frequency chip, a memory, a microcontroller, a system-on-a-chip, and a combination thereof.

* * * * *